(12) United States Patent
Nakatani et al.

(10) Patent No.: US 7,875,496 B2
(45) Date of Patent: Jan. 25, 2011

(54) FLIP CHIP MOUNTING METHOD, FLIP CHIP MOUNTING APPARATUS AND FLIP CHIP MOUNTING BODY

(75) Inventors: Seiichi Nakatani, Osaka (JP); Seiji Karashima, Osaka (JP); Takashi Kitae, Osaka (JP); Yoshihisa Yamashita, Kyoto (JP); Takashi Ichiryu, Osaka (JP)

(73) Assignee: Panasonic Corporation, Osaka (JP)

( * ) Notice: Subject to any disclaimer, the term of this patent is extended or adjusted under 35 U.S.C. 154(b) by 147 days.

(21) Appl. No.: 11/914,416

(22) PCT Filed: Mar. 30, 2006

(86) PCT No.: PCT/JP2006/306688

§ 371 (c)(1),
(2), (4) Date: Nov. 14, 2007

(87) PCT Pub. No.: WO2006/123478

PCT Pub. Date: Nov. 23, 2006

(65) Prior Publication Data

US 2009/0203170 A1    Aug. 13, 2009

(30) Foreign Application Priority Data

May 17, 2005   (JP) .............................. 2005-143744

(51) Int. Cl.
*H01L 21/00*     (2006.01)
(52) U.S. Cl. .................. 438/108; 438/597; 438/107; 257/778; 257/789; 257/787; 257/737; 257/795
(58) Field of Classification Search ........................ None
See application file for complete search history.

(56) References Cited

U.S. PATENT DOCUMENTS 5,145,532 A    9/1992   Fukunaga et al.

(Continued)

FOREIGN PATENT DOCUMENTS

JP    60-260192    12/1985

(Continued)

OTHER PUBLICATIONS

Chinese Office Action, dated Sep. 19, 2008.

*Primary Examiner*—David Vu
*Assistant Examiner*—Shantanu C Pathak
(74) *Attorney, Agent, or Firm*—Hamre, Schumann, Mueller & Larson, P.C.

(57) ABSTRACT

A flip chip mounting method includes holding a circuit board (213) and a semiconductor chip (206), aligning the circuit board (213) with the semiconductor chip (206) while holding them with a predetermined gap therebetween, heating the circuit board (213) or the semiconductor chip (206) to a temperature at which solder powder in a solder resin composition (216) formed of solder powder (214) and a resin (215) is melted, supplying the solder resin composition (216) by a capillary phenomenon, and curing the resin (215), wherein the melted solder powder (214) in the solder resin composition (216) is moved through the predetermined gap across which the circuit board (213) and the semiconductor chip (206) are held, and self-assembled and grown, whereby the connection terminals (211) and the electrode terminals (207) are connected to each other electrically. According to this configuration, a flip chip mounting method having high productivity and reliability, which enables a next generation semiconductor chip to be mounted on a circuit board, a mounted body thereof, and a mounting apparatus thereof are provided.

12 Claims, 11 Drawing Sheets

U.S. PATENT DOCUMENTS

| | | | |
|---|---|---|---|
| 5,906,682 A | 5/1999 | Bouras et al. | |
| 6,674,178 B1 * | 1/2004 | Ikegami | 257/789 |
| 7,524,748 B2 * | 4/2009 | Fujimoto et al. | 438/597 |
| 2002/0013015 A1 * | 1/2002 | Kado et al. | 438/107 |
| 2002/0121706 A1 * | 9/2002 | Tatsuta et al. | 257/778 |
| 2002/0167093 A1 * | 11/2002 | Koike | 257/778 |
| 2004/0206800 A1 * | 10/2004 | Arai et al. | 228/6.2 |
| 2007/0001313 A1 | 1/2007 | Fujimoto et al. | |

FOREIGN PATENT DOCUMENTS

| | | | |
|---|---|---|---|
| JP | 1-157796 | | 6/1989 |
| JP | 4-3443 | | 1/1992 |
| JP | 9-212347 | | 9/1997 |
| JP | 2000-94179 | | 4/2000 |
| JP | 2000-299330 | | 10/2000 |
| JP | 2000299330 A | * | 10/2000 |
| JP | 2000-332055 | | 11/2000 |
| JP | 2002-353763 | | 12/2002 |
| JP | 2003-100810 | | 4/2003 |
| JP | 2004-260131 | | 9/2004 |
| WO | WO 99/00835 | | 1/1999 |
| WO | WO 2004/070827 | * | 8/2004 |

* cited by examiner ate solder bumps all at one time, and attract attention as techniques that are adaptable to the mounting of the next-generation semiconductor chip on the circuit board.

FLIP CHIP MOUNTING METHOD, FLIP CHIP MOUNTING APPARATUS AND FLIP CHIP MOUNTING BODY

TECHNICAL FIELD

The present invention relates to a flip chip mounting method for mounting a semiconductor chip on a circuit board, and in particular, to a flip chip mounting method, a flip chip mounting apparatus, and a flip chip mounted body, which are adaptable to even a semiconductor chip with a narrower pitch and have high productivity and connection with excellent reliability.

BACKGROUND ART

In recent years, with a trend toward a higher density and a higher degree of integration for a semiconductor integrated circuit (hereinafter, abbreviated as a "semiconductor") chip used for electronic equipment, the number of pins of electrode terminals of a semiconductor chip has been increased and the pitch thereof has been decreased rapidly. For mounting these semiconductor chips on circuit boards, flip chip mounting is used widely in order to decrease a wiring delay.

In the flip chip mounting, solder bumps generally are formed on electrode terminals of the semiconductor chip, which then are joined to connection terminals formed on the circuit board at one time.

However, in order to mount a next-generation semiconductor chip having more than 5,000 electrode terminals on a circuit board, it is necessary to form solder bumps that correspond to a narrow pitch of 100 µm or less, but it is difficult to adapt to it with a current technique for forming solder bumps.

Moreover, since it is necessary to form a large number of solder bumps that correspond to the number of the electrode terminals, the productivity has to be raised by shortening a mounting cycle for each chip, along with the reduction in cost.

Similarly, in the semiconductor chip, the increase in the number of the electrode terminals has brought about a transition from peripheral-arranged electrode terminals to area-arranged electrode terminals.

Moreover, due to the demands for a higher density and a higher degree of integration, a limitation on a semiconductor process is expected to develop from 90 nm to 65 nm and further to 45 nm. In order to adapt to this, there is a strong demand for an insulating material having a low dielectric constant, and for the purpose of satisfying the demand, an attempt has been made so as to introduce a porous insulating material. However, in order to use a porous insulating material, mounting at a low load is required so as to alleviate the damage to the insulating material and an active circuit. Furthermore, mounting at a low load also is desired in order to prevent a semiconductor chip from being broken during handling due to the thinning of the semiconductor chip. Particularly, in the case of the area arrangement, it is necessary to constitute electrodes on an active circuit, so that there is a demand for a mounting method at a lower load.

Thus, there is a demand for a flip chip mounting method that is adaptable to a decrease in thickness and an increase in density due to the future development of the semiconductor process.

Conventionally, as a technique for forming solder bumps, plating, screen printing, and the like have been developed. The plating is suitable for a narrow pitch, but has a problem in productivity due to its complicated process. On the other hand, the screen printing has excellent productivity, but is not suitable for narrowing a pitch because of the use of a mask.

In the light of the problems described above, several techniques for forming solder bumps selectively on electrode terminals of a semiconductor chip or connection terminals on a circuit board have been developed recently. These techniques not only are suitable for forming fine solder bumps but also have excellent productivity because they can form the solder bumps all at one time, and attract attention as techniques that are adaptable to the mounting of the next-generation semiconductor chip on the circuit board.

As one of these techniques, there is the following technique: a solder paste, which is a mixture of solder powder and flux, is applied wholly onto a circuit board whose surface is provided with connection terminals, and the circuit board is heated so as to melt the solder powder, whereby solder humps are formed selectively on the connection terminals that have high wettability (see Patent Document 1, for example).

There also is a technique called a super solder method. According to this technique, a paste-like composition (chemical reaction deposition-type solder) that contains an organic acid lead salt and metallic tin as main components is applied wholly onto a circuit board on which connection terminals are formed, and the circuit board is heated so as to cause a substitution reaction between Pb and Sn, thereby depositing a Pb/Sn alloy selectively on the connection terminals of the circuit board (see Patent document 2, for example).

Conventional flip chip mounting further requires the step of injecting a resin called an underfill between the semiconductor chip and the circuit board in order to fix the semiconductor chip on the circuit board, after mounting the semiconductor chip on the circuit board on which solder bumps are formed. Because of this, there also have been problems of an increase in the number of steps and a decrease in a yield.

Then, as a method for establishing an electric connection between electrode terminals of the semiconductor chip and connection terminals of the circuit board, which are opposed to each other, and fixing the semiconductor chip onto the circuit board both at the same time, a flip chip mounting technique using an anisotropic electrically conductive material has been developed. In this technique, by supplying a thermosetting resin containing electrically conductive particles between the circuit board and the semiconductor chip, and then heating the thermosetting resin while applying a pressure to the semiconductor chip at the same time, it is possible to establish the electric connection between the semiconductor chip and the circuit board and fix the semiconductor chip to the circuit board at the same time (for example, see Patent Document 3).

However, in both of the method for forming solder bumps described in Patent Document 1 and the super solder method described in Patent Document 2, since the paste-like composition simply is supplied onto the circuit board by application, local variations in thickness and concentration occur, resulting in variations in the solder deposition amount for individual electrode terminals and connection terminals. Consequently, it is not possible to achieve solder bumps with uniform heights. Also, in these methods, since the paste-like composition is supplied by application onto the circuit board whose surface is provided with the connection terminals, namely, with projections or depressions, a sufficient amount of solder cannot be supplied onto the connection terminals serving as the projections, making it difficult to achieve a desired solder bump height necessary for the flip chip mounting.

Moreover, in the flip chip mounting method described in Patent Document 3, there are many problems in productivity and reliability that are to be solved as described below.

First, since the electric conduction between the respective terminals is obtained by mechanical contact via the electrically conductive particles, it is difficult to achieve a stable conductive state. Second, since a distance varies depending upon an amount of the electrically conductive particles that are present between the electrode terminals of the semiconductor chip and the connection terminals of the circuit board, the electric connection is unstable. Third, in order to realize the stable electric connection, crimping by pressing at a high pressure (load) is required, which is likely to break a semiconductor chip.

Patent Document 1: JP 2000-94179 A
Patent Document 2: JP 1(1989)-157796 A
Patent Document 3: JP 2000-332055 A

DISCLOSURE OF INVENTION

In order to solve the above problems, the present invention provides a flip chip mounting method, a flip chip mounting apparatus, and a flip chip mounted body which are capable of mounting a semiconductor chip having a number of electrode terminals on a semiconductor chip, and have high productivity and reliability.

A flip chip mounting method of the present invention for placing a semiconductor chip having a plurality of electrode terminals so that it is opposed to a circuit board having a plurality to connection terminals, and connecting the connection terminals of the circuit board electrically to the electrode terminals of the semiconductor chip, includes: a holding step of holding the circuit board and the semiconductor chip; an arrangement step of aligning the connection terminals of the circuit board with the electrode terminals of the semiconductor chip while holding the connection terminals and the electrode terminals in a contact state, or aligning the connection terminals of the circuit board with the electrode terminals of the semiconductor chip while holding the connection terminals and the electrode terminals with a predetermined gap therebetween; a heating step of heating at least the circuit board or the semiconductor chip to a temperature at which solder powder in a solder resin composition formed of the solder powder and a resin is melted; a supply step of supplying the solder resin composition to the predetermined gap across which the circuit board and the semiconductor chip are held, from at least one end face direction of the semiconductor chip by a capillary phenomenon; and a curing step of curing the resin in the solder resin composition, wherein in the supply step, the melted solder powder in the solder resin composition is moved through the predetermined gap across which the circuit board and the semiconductor chip are held, and the solder powder is self-assembled and grown, thereby connecting the connection terminals electrically to the electrode terminals.

A flip chip mounting apparatus of the present invention for flip chip mounting a semiconductor chip on a circuit board includes: holding means for holding the circuit board and the semiconductor chip; arrangement means for aligning the connection terminals of the circuit board with the electrode terminals of the semiconductor chip while holding the connection terminals and the electrode terminals in a contact state, or aligning the connection terminals of the circuit board with the electrode terminals of the semiconductor chip while holding the connection terminals and the electrode terminals with a predetermined gap therebetween; heating means for heating at least the circuit board or the semiconductor chip to a temperature at which solder powder in a solder resin composition made of the solder powder and a resin is melted; supply means for supplying the solder resin composition to the predetermined gap across which the circuit board and the semiconductor chip are held, from at least one end face direction of the semiconductor chip by a capillary phenomenon; and curing means for curing the resin in the solder resin composition.

A flip chip mounted body of the present invention includes: a circuit board having a plurality of connection terminals; a semiconductor chip having a plurality of electrode terminals placed so as to be opposed to the connection terminals; a solder layer that connects the connection terminals of the circuit board electrically to the electrode terminals of the semiconductor chip; and a first insulating resin covering at least the solder layer and a second insulating resin covering the first insulating resin and fixing the circuit board and the semiconductor chip to each other.

DESCRIPTION OF THE INVENTION

Figure 1A:
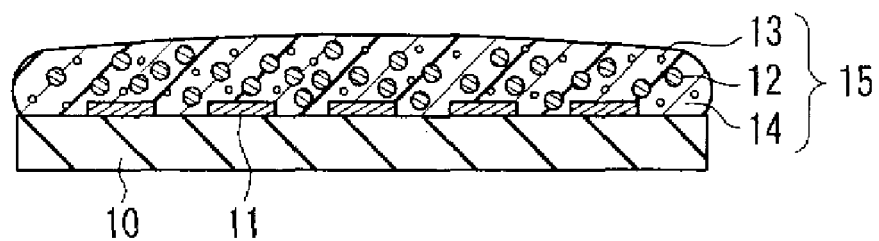
FIGS. 1A to 1C are cross-sectional process views showing a basic mechanism of a flip chip mounting method of the present invention.

The present invention relates to a flip chip mounting method in which connection terminals of a circuit board are aligned with electrode terminals of a semiconductor chip while the connection terminals and the electrode terminals are held in a contact state, or the connection terminals of the circuit board are aligned with the electrode terminals of the semiconductor chip while the connection terminals and the electrode terminals are held with a predetermined gap therebetween; a melted solder resin composition is supplied from at least one end face direction of the semiconductor chip by a capillary phenomenon; the resin in the solder resin composition is cured; at the time of the supply, melted solder powder in the solder resin composition is moved through the predetermined gap across which the circuit board and the semiconductor chip are held, and the solder powder is self-assembled and grown, whereby the connection terminals are connected electrically to the electrode terminals.

In the present invention, a resin component of the solder resin composition supplied from at least one direction may be discharged from a direction other than the at least one direction.

Furthermore, in the supply step, the solder resin composition supplied from at least one end face direction of the semiconductor chip may be supplied while being moved along the end face.

Furthermore, in the holding step, the circuit board and the semiconductor chip may be held by aspiration.

Furthermore, in the holding step, a plurality of the semiconductor chips may be held.

Furthermore, the semiconductor chip is mounted on an interposer having a plurality of external connection terminals, thereby connecting the connection terminals of the circuit board electrically to the external connection terminals.

These methods enable the mounting at a low load, so that a thin or area-arranged semiconductor chip, or an insulating material with a low dielectric constant can be used. Furthermore, the gap between the electrode terminals of the semiconductor chip and the connection terminals of the circuit board can be kept at an optimum distance. Therefore, the disconnection, connection with a high resistance, and the like are unlikely to occur due to the uniform connection between the electrode terminals and the connection terminals, which can enhance a yield Furthermore, the circuit board and the semiconductor chip can be fixed with a resin at a low load simultaneously with the electrical connection, so that a flip chip mounted body excellent in productivity and reliability can be realized.

Furthermore, a flip chip mounting method of the present invention for placing a semiconductor chip having a plurality of electrode terminals so that it is opposed to a circuit board having a plurality to connection terminals, and connecting the connection terminals of the circuit board electrically to the electrode terminals of the semiconductor chip, includes: a holding step of holding the circuit board and the semiconductor chip; an arrangement step of aligning the connection terminals of the circuit board with the electrode terminals of the semiconductor chip while holding the connection terminals and the electrode terminals in a contact state, or aligning the connection terminals of the circuit board with the electrode terminals of the semiconductor chip while holding the connection terminals and the electrode terminals with a predetermined gap therebetween; a first heating step of heating at least the circuit board or the semiconductor chip to a temperature at which solder power in a solder resin composition formed of the solder powder and a first resin is melted; a first supply step of supplying the solder resin composition to the predetermined gap across which the circuit board and the semiconductor chip are held, from at least one end face direction of the semiconductor chip by a capillary phenomenon; a connection step of moving the melted solder powder in the resin composition through the predetermined gap across which the circuit board and the semiconductor chip are held, and self-assembling and growing the solder powder to form a solder layer, thereby connecting the connection terminals electrically to the electrode terminals; a discharging step of discharging a resin composition other than the solder layer; a second heating step of heating at least the circuit board or the semiconductor chip to a temperature at which the solder layer is not melted and the second resin is melted; a second supply step of supplying a second resin to the predetermined gap across which the circuit board and the semiconductor chip are held, from at least one end face direction of the semiconductor chip by a capillary phenomenon; and a curing step of curing the second resin.

Furthermore, in the first supply step, the solder resin composition supplied from at least one direction may be discharged from a direction other than the at least one direction.

Furthermore, the second supply step of supplying the second resin may include a first step of supplying a first insulating resin covering at least a side surface of the solder layer; and a second step of supplying a second insulating resin covering the first insulating resin and filling a predetermined gap between the circuit board and the semiconductor chip, wherein the second resin is composed of the first insulating resin and the second insulating resin Furthermore, the above-mentioned flip chip mounting method further may include the step of provisionally curing the first insulating resin after the first step.

Furthermore, the first insulating resin may cover at least a side surface of the solder layer due to surface tension.

Furthermore, the first insulating resin may be made of a material having a modulus of elasticity lower than that of the second insulating resin.

Furthermore, the solder resin composition may be a viscous body.

Furthermore, the viscous body may be made of a resin, a solvent having a high boiling point, or oil.

These methods further can decrease the possibility of the solder powder remaining between the solder layers. Therefore, a flip chip mounted body excellent in electrical characteristics such as the enhancement of a withstand voltage and the prevention of a short-circuit, and the mechanical characteristics with respect to a stress can be realized.

Furthermore, a flip chip mounting apparatus of the present invention for flip chip mounting a semiconductor chip on a circuit board includes: holding means for holding the circuit board and the semiconductor chip; arrangement means for aligning the connection terminals of the circuit board with the electrode terminals of the semiconductor chip while holding the connection terminals and the electrode terminals in a contact state, or aligning the connection terminals of the circuit board with the electrode terminals of the semiconductor chip while holding the connection terminals and the electrode terminals with a predetermined gap therebetween; heating means for heating at least the circuit board or the semiconductor chip to a temperature at which solder powder in a solder resin composition made of the solder powder and a resin is melted; supply means for supplying the solder resin composition to the predetermined gap across which the circuit board and the semiconductor chip are held, from at least one end face direction of the semiconductor chip by a capillary phenomenon; and curing means for curing the resin in the solder resin composition.

Furthermore, the supply means may be a dispenser.

Furthermore, the holding means may use aspiration.

Furthermore, the holding means may hold the circuit board and the semiconductor chip in such a manner that the circuit board and the semiconductor chip are inclined. Furthermore, the heating means further may include cooling means.

Furthermore, the above flip chip mounting apparatus further may include inspection means for inspecting an electrical connection between the semiconductor chip and the circuit board.

This apparatus can produce a flip chip mounted body that is excellent in reliability and has low cost and satisfactory productivity.

Furthermore, a flip chip mounted body of the present invention includes: a circuit board having a plurality of connection terminals; a semiconductor chip having a plurality of electrode terminals placed so as to be opposed to the connection terminals; a solder layer that connects the connection terminals of the circuit board electrically to the electrode terminals of the semiconductor chip; and a first insulating resin covering at least the solder layer and a second insulating resin covering the first insulating resin and fixing the circuit board and the semiconductor chip to each other.

Furthermore, the first insulating resin may be made of a material having a modulus of elasticity lower than that of the second insulating resin.

According to this configuration, a flip chip mounted body excellent in reliability of connection and the like and mechanical strength can be realized.

According to the flip chip mounting method and the mounting apparatus thereof according to the present invention, the connection state between the electrode terminals of the semiconductor chip and the connection terminals of the circuit board can be uniform, so that excellent connection reliability and high production efficiency can be realized. The flip chip mounting method and the mounting apparatus thereof according to the present invention are effective for the connection between boards such as a circuit board and a wiring board, as well as the connection between flip-chips and interposers.

Arbitrary solder particles can be selected to be used. Examples thereof listed in Table 1 can be used. Materials listed in Table 1 as examples may be used alone or in combination appropriately. Moreover, it is preferable to use a material whose melting point is lower than a curing temperature of the thermosetting resin as the solder particles, because the resin is heated and cured after the resin flows and is self-assembled, whereby electrical connection and sealing with the resin can be achieved.

TABLE 1

| Composition of solder particles | Melting point (solidus) (° C.) |
|---|---|
| Sn—58Bi | 139 |
| Sn—37Pb | 183 |
| Sn—9Zn | 199 |
| Sn—3.0Ag—0.5Cu | 217 |
| Sn—3.5Ag | 221 |
| Sn—0.7Cu | 228 |
| 12Sn—2.0Ag—10Sb—Pb | 240 |

A melting point of the solder particles preferably ranges from 100° C. to 300° C., and more preferably ranges from 139° C. to 240° C., as shown in Table 1. If the melting point is less than 100° C., a problem in durability tends to occur. If the melting point is more than 300° C., it becomes difficult to select the resin.

An average particle diameter of the solder particles preferably ranges from 1 μm to 30 μm, and more preferably ranges from 5 μm to 20 μm. When the average particle diameter is less than 1 μm, it becomes difficult to melt the solder particles due to the surface oxidation, and the formation of the electric connectors tends to take too much time. When the average particle diameter is more than 30 μm, it becomes difficult to obtain the electric connectors due to the sedimentation of the solder particles. Note here that the average particle diameter can be measured using a commercially available particle size distribution analyzer. For example, the average particle diameter can be measured using a laser diffraction particle size analyzer (LA920) available from HORIBA, Ltd., a laser diffraction particle size analyzer (SALD2100) available from Shimadzu Corporation, or the like.

Next, the resin will be described. Typical examples of the resin include: thermosetting resins such as epoxy resin, phenol resin, silicone resin, diallyl phthalate resin, furan resin, and melamine resin; thermoplastic resins such as polyester elastomer, fluororesin, polyimide resin, polyamide resin, and aramid resin; photocurable (ultraviolet curable) resins; and mixtures thereof in combination.

The mixing ratio by weight of the solder particles and the resin preferably is in the following range: conductive particles:resin=76 to 4:24 to 96, more preferably, solder particles:resin=50 to 20:50 to 80. It is preferable to use the solder particles and the resin after they have been mixed together homogenously. For example, 30% by weight of the solder particles and 70% by weight of the epoxy resin are mixed homogenously by a kneading machine, and the thus-obtained mixture is formed into a paste while the dispersion state of the solder particles is kept. A preferred viscosity of the paste ranges from 20 to 100 Pa·S (pascal second).

Furthermore, in preferred examples of the present invention, lead-free Sn.3Ag.0.5Cu solder alloy particles whose melting point ranges from 200° C. to 250° C. can be used as the solder particles, for example. When the resin is a thermosetting resin, it is preferable that the curing temperature of the resin is higher than the melting point of the solder. With this configuration, it is possible to cure the resin during the steps of forming electric connectors and forming metal bumps, thus allowing the operation process to be shortened.

The basic mechanism of an exemplary flip chip mounting method based on the concept of the present invention will be described with reference to FIGS. 1A to 1C. First, as shown in FIG. 1A, a solder resin composition 15 containing solder powder 12, a convection additive 13, and a resin 14 is supplied onto a circuit board 10 on which a plurality of connection terminals 11 are formed.

Figure 1B:
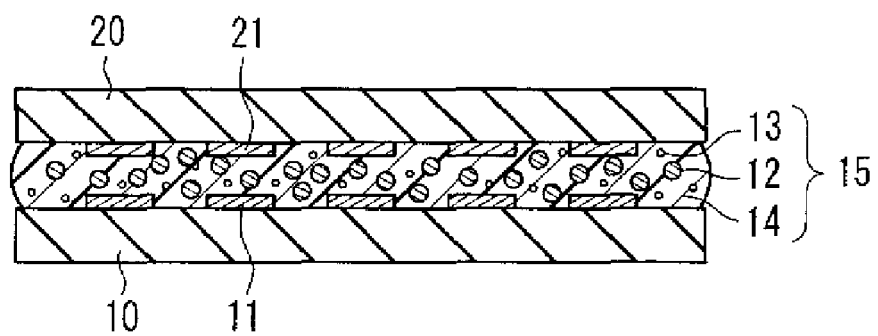
Figure 1C:
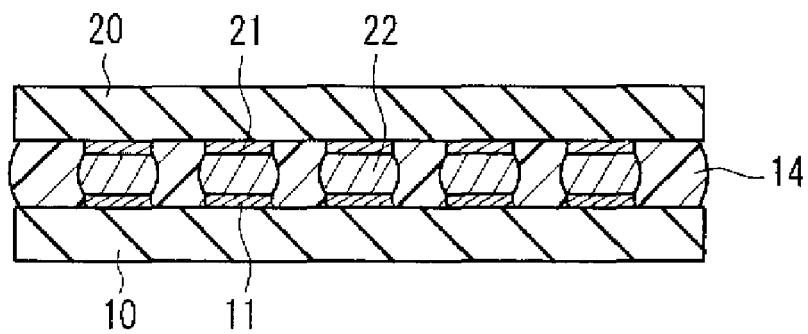

Next, as shown in FIG. 1B, the circuit board 10 and a semiconductor chip 20 are brought into contact with each other through the intervening solder resin composition 15 that is supplied between the circuit board 10 and the semiconductor chip 20. At this time, the semiconductor chip 20 having a plurality of electrode terminals 21 is disposed so as to be opposed to the circuit board 10 having the plurality of the connection terminals 11. In this state, the circuit board 10 is heated so as to melt the solder resin composition 15. Here, the circuit board 10 is heated at a temperature higher than a melting point of the solder powder 12. The melted solder powder 12 is bound together in the melted resin 14, and is self-assembled between the connection terminal 11 and the electrode terminal 21 that have high wettability so as to form a solder connector 22, as shown in FIG. 1C.

Then, the resin 14 is cured, whereby the semiconductor chip 20 is fixed to the circuit board 10.

This method is characterized in that the solder resin composition 15 containing the solder powder 12 further contains the convection additive 13 that is boiled at a temperature at which the solder powder 12 is melted. That is, at the temperature at which the solder powder 12 is melted, the convection additive 13 contained in the solder resin composition 15 is boiled. Then, the convection of the boiled convection additive 13 occurs in the resin 14, thereby promoting the transfer of the melted solder powder 12 that flows in the resin 14. As a result, the melted solder powder that has been grown uniformly is self-assembled between the connection terminal 11 of the circuit board 10 and the electrode terminal 21 of the semiconductor chip 20 that have high wettability, whereby the connection terminal 11 and the electrode terminal 21 are connected electrically via the uniform and fine solder connector 22.

That is, the above-described method is intended to add means for transferring the melted solder powder forcefully by allowing the solder resin composition containing the solder powder further to contain the convection additive. Incidentally, the convection additive may be a solvent that is boiled or evaporated by heat, and hardly remains in the resin after the completion of the steps.

In the light of the similar technical standpoint, the present invention has realized a novel flip chip mounting method and flip chip mounting apparatus with high reliability by supplying and transferring melted solder powder through a capillary phenomenon without using a convection additive. Furthermore, according to the embodiments of the present invention, a flip chip mounted body having high productivity and excellent reliability can be realized.

Hereinafter the embodiments of the present invention will be described in detail with reference to the drawings The drawings are shown under the condition of being magnified arbitrarily for ease of understanding.

Embodiment 1

Figure 2A:
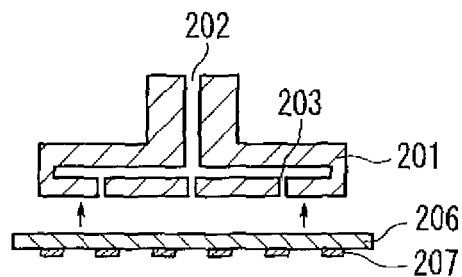
FIGS. 2A to 2E are schematic cross-sectional process views illustrating a flip chip mounting method in Embodiment 1 of the present invention.

Hereinafter, a flip chip mounting method in Embodiment 1 of the present invention will be described with reference to FIGS. 2A-2E. FIGS. 2A-2E are schematic cross-sectional process views illustrating the flip chip mounting method in Embodiment 1 of the present invention. First, as shown in FIG. 2A, a semiconductor chip 206 having a plurality of electrode terminals 207 is held by a pickup jig 201. The semiconductor chip 206 is aspirated to be held by vacuum suction, for example, via a suction path 203 formed of small holes and a suction pipe 202 provided in the pickup jig 201.

Figure 2B:
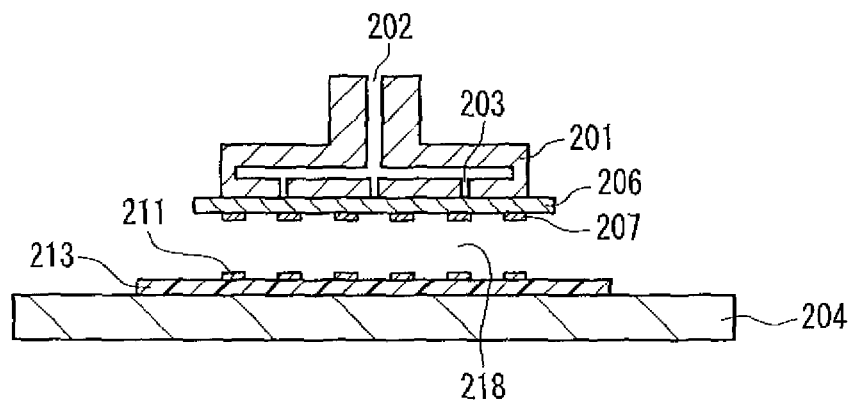

Next, as shown in FIG. 2B, the pickup jig 201 holding the semiconductor chip 206 is placed, for example, on a circuit board 213, which has a plurality of connection terminals 211, held by a holding platform 204 such as a table by aspiration or the like. In the arrangement, the electrode terminals 207 of the semiconductor chip 206 and the connection terminals 211 of the circuit board 213 are aligned so as to be opposed to each other, for example, with an image recognition apparatus such as a camera. The circuit board 213 also can be fixed with its position regulated, by being accommodated in a concave portion (not shown) provided in the holding platform 204.

Then, under the condition that the semiconductor chip 206 and the circuit board 213 are aligned, the holding platform 204 or the pickup jig 201 is moved to a position where a predetermined spacing is provided between the electrode terminals 207 of the semiconductor chip 206 and the connection terminals 211 of the circuit board 213. In this case, the predetermined spacing is provided to such a degree that a solder resin composition described below can enter by a capillary phenomenon, and the electrode terminals 207 and the connection terminals 211 do not contact each other and melted solder powder can enter therebetween For example, the distance between the electrode terminals 207 of the semiconductor chip 206 and the connection terminals 211 of the circuit board 213 is adjusted to be about 10 μm to 50 μm, considering, for example, the thickness of the semiconductor chip 206, etc.

Furthermore, the semiconductor chip 206 or the circuit board 213 is heated, for example, to a temperature (150° C. to 250° C.) at which solder powder is melted with a heating apparatus such as an external heater (not shown) or a heater (not shown) incorporated in the pickup jig 201 or the holding platform 204.

Figure 2C:
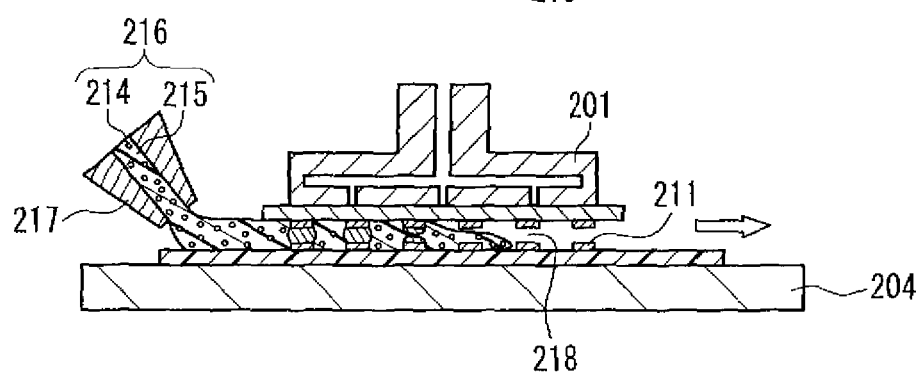

Next, as shown in FIG. 2C, a solder resin composition 216 containing solder powder 214 and a resin 215 is supplied to a gap 218 having a predetermined size from at least one end face direction of the semiconductor chip 206, using a coating apparatus 217 such as a dispenser, by a capillary phenomenon. At this time, while the solder resin composition 216 supplied to the gap 218 is flowing through the gap 218, at least a resin component is discharged from an opposite direction (represented by an open arrow). Herein, as the solder powder, for example, Sn—Ag based solder powder is used.

In the step in which a solder resin component is discharged while the solder resin composition 216 is supplied and flows, the solder powder 214 contained in the solder resin composition 216 is melted by heating. Then, the melted solder powder 214 is self-assembled and grows between the connection terminals 211 of the circuit board 213 and the electrode terminals 207 of the semiconductor chip 206, whereby solder layers 219 connecting the connection terminals 211 electrically to the electrode terminals 207 are formed. More specifically, along with the flow of the solder resin composition 216, the melted solder powder 214 flowing in the solder resin composition 216 is self-assembled selectively on the connection terminals 211 and the electrode terminals 207 having high wettability, whereby the solder layers 219 are formed finally between the connection terminals 211 and the electrode terminals 207.

It is considered that the bonding of the melted solder powder 214 and the self-assembly thereof on the connection terminals 211 and the electrode terminals 207 proceed extremely locally in a short period of time in the solder resin composition 216. Therefore, in order to allow the self-assembly to proceed uniformly over an entire region of the semiconductor chip 206 and the uniform solder layers 219 without variations to be formed, it is necessary to use means for moving the melted solder powder 214 floating in the solder resin composition 216 forcefully.

Figure 2D:
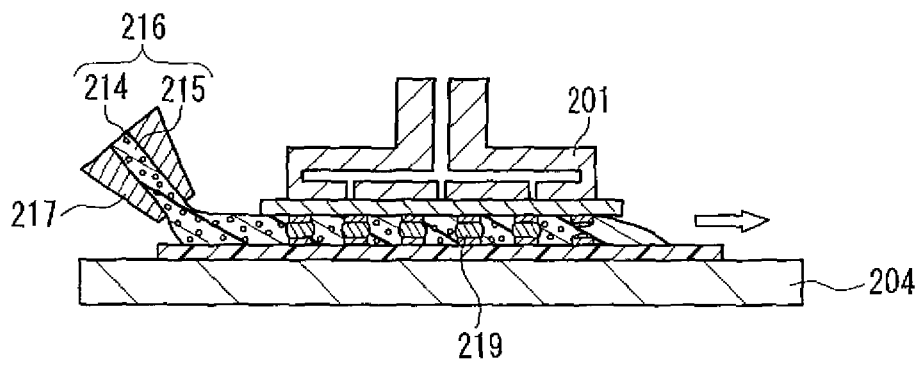

According to Embodiment 1 of the present invention, the heated solder resin composition 216 supplied to the gap 218 by a capillary phenomenon flows through the gap 218 and a resin component is discharged outside. During this step, the melted solder powder 214 has a functional effect similar to the forceful movement in the solder resin composition 216 supplied to the gap 218. That is, the melted solder powder brings about a functional effect similar to the promotion of the movement of the melted solder powder by the convection additive shown in FIGS. 1A-1C Next, as shown in FIG. 2D, as the solder resin composition 216 flows through the gap 218, the solder layers 219 are formed successively between the electrode terminals 207 and the connection terminals 211. Then, after the solder layers 219 are formed, in the case where the resin 215 in the solder resin composition 216 supplied to the gap 218 is, for example, a thermoplastic resin, the resin 215 is cured by, for example, water circulation, forceful cooling by a cooling apparatus (not shown) such as a Peltier element incorporated in the pickup jig 201 or the holding platform 204, or natural cooling. Consequently, the electrode terminals 207 of the semiconductor chip 206 and the connection terminals 211 of the circuit board 213 are connected electrically by the solder layers 219, and simultaneously they adhere to or are fixed to each other with the resin 215 in a similar manner to that of an underfill. In the case where the resin 215 in the solder resin composition 216 is, for example, a thermosetting resin, the above cooling may be conducted after the pickup jig 201 or the holding platform 204 is heated once to a temperature for curing the resin 215 or higher to cure the resin 215. At this time, in the case where the resin 215 is cured to shrink, it is preferred to set the gap 218 to be narrow to such a degree that the resin 215 is cured to shrink. This can prevent the decrease in adhesive strength caused by the peeling between the resin 215 and the semiconductor chip 206.

Figure 2E:
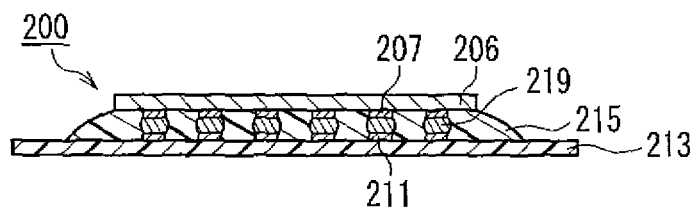

Then, as shown in FIG. 2E, the resultant stack is removed from the pickup jig 201, whereby a flip chip mounted body 200 in which the semiconductor chip 206 is flip-chip mounted on the circuit board 213 can be produced.

A specific example will be described. In FIG. 2B, the spacing between the electrode terminals 207 of the semiconductor chip 206 and the connection terminals 211 of the fiberglass-reinforced epoxy impregnated resin circuit board 213 was adjusted to be 20 μm. In this state, a solder resin paste (heated to 250° C.), in which 70 parts by weight of a bisphenol F epoxy resin (Epicoat 806 manufactured by Japan Epoxy Resin Co., Ltd.) and 30 parts by weight of Sn.3Ag.0.5Cu powder (melting point: 217° C.) having an average particle size of 12 μm were mixed uniformly, was allowed to enter between the circuit board and the surface of the semiconductor chip from one direction by a capillary phenomenon, using a dispenser, as shown in FIGS. 2C-2D, and discharged in the other direction. The heating temperature at this time was 250° C. After that, the temperature was cooled to room temperature, and the cross-section was observed to confirm the state in FIG. 2E.

According to Embodiment 1 of the present invention, the electrode terminals of the semiconductor chip and the connection terminals of the circuit board are connected more precisely by the uniform solder layers formed by the self-assembly of the melted solder powder supplied by a capillary phenomenon.

Furthermore, the resin filling the gap between the circuit board and the semiconductor chip is cured, whereby the semiconductor chip can be fixed to the circuit board.

Thus, the electrical connection between the electrode terminals of the semiconductor chip and the connection terminals of the circuit board, and the fixing of the semiconductor chip to the circuit board can be performed simultaneously, so that a flip chip mounted body that is excellent in reliability and has high productivity can be produced.

Furthermore, the solder resin composition is supplied using a capillary phenomenon and allowed to flow in the gap. Therefore, the solder resin composition may not contain a convection additive. As a result, the selection range of the solder resin composition can be broadened.

Furthermore, the solder layers are formed by the self-assembly of the melted solder powder flowing in the solder resin composition between the electrode terminals of the semiconductor chip and the connection terminals of the circuit board held at a predetermined spacing. Therefore, the load applied to the semiconductor chip and the circuit board can be decreased. Consequently, a highly reliable flip chip mounted body, which prevents the deformation due to the load during mounting, can be realized even with respect to a thinned semiconductor chip.

In Embodiment 1 of the present invention, as the solder resin composition, it is preferred to use a resin which is in a liquid form or whose viscosity is decreased at a temperature at which the solder powder is melted. For example, as a thermosetting resin that is in a liquid form at a temperature at which the solder powder is melted, epoxy resin, polyimide resin, polyphenylene ether resin, phenol resin, fluorine resin, isocyanate resin, or the like can be used. Furthermore, as a thermoplastic resin whose viscosity is decreased at a temperature at which the solder powder is melted, wholly aromatic polyester, fluorine resin, polyphenylene oxide resin, syndiotactic polystyrene resin, polyimide resin, polyamide resin, aramid resin, polyphenylene sulfide resin, or the like can be used.

Figure 3A:
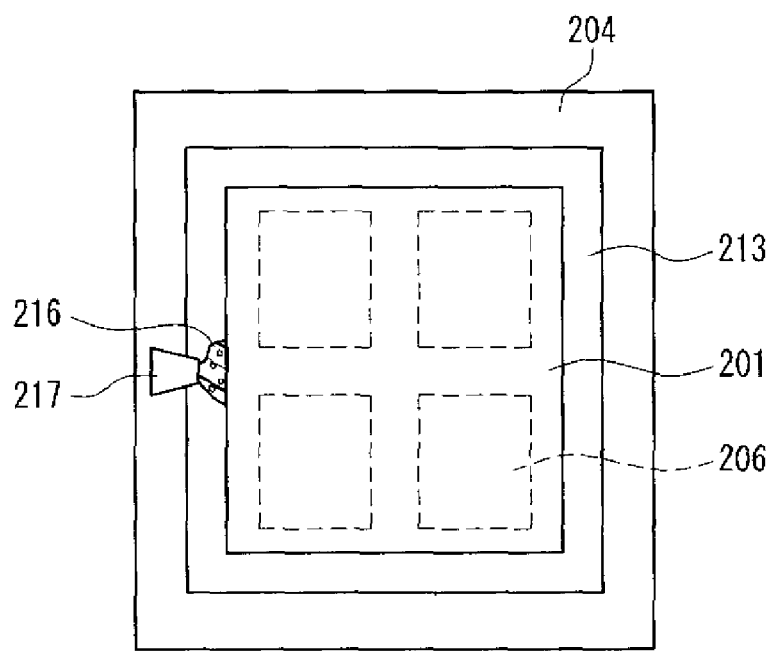
FIGS. 3A and 3B are plan views illustrating a method for supplying a solder resin composition in Embodiment 1 of the present invention.
Figure 3B:
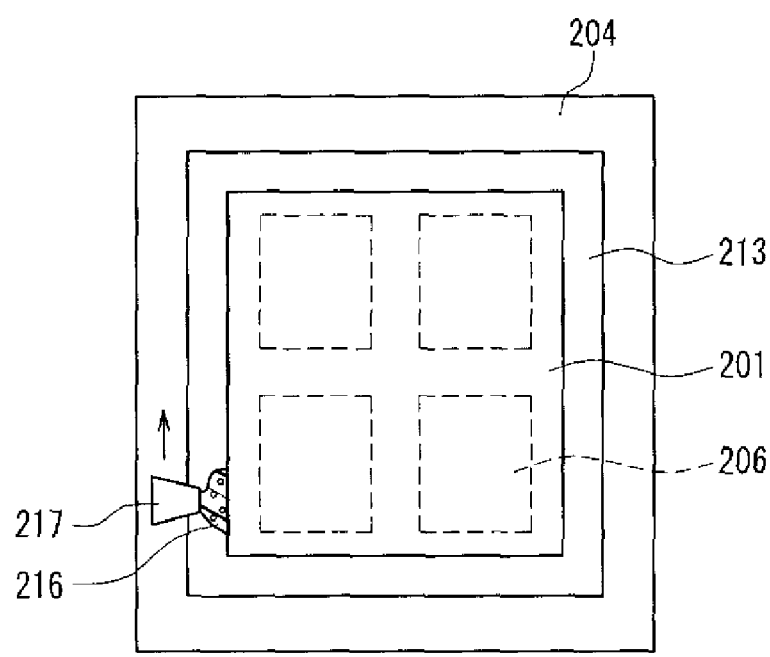
Figure 4A:
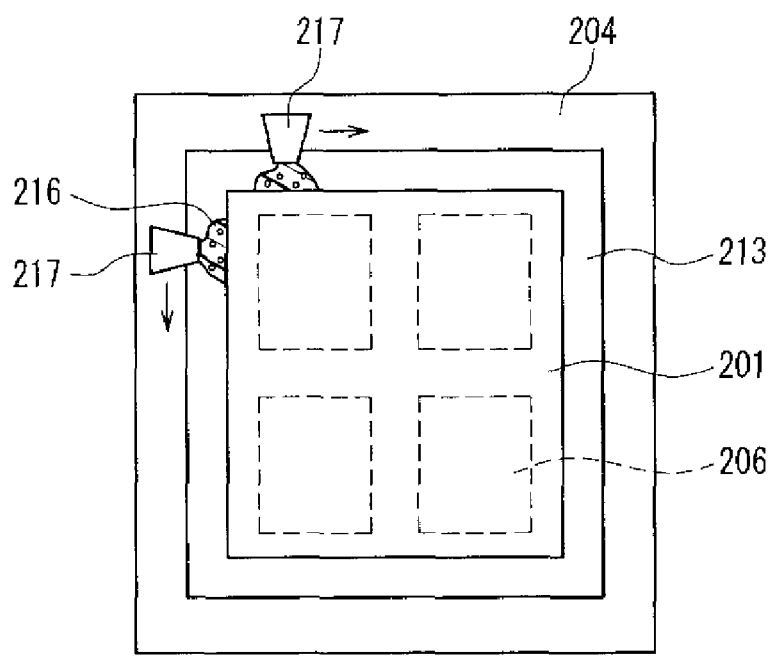
FIGS. 4A and 4B are plan views illustrating a method for supplying a solder resin composition in Embodiment 1 of the present invention.
Figure 4B:
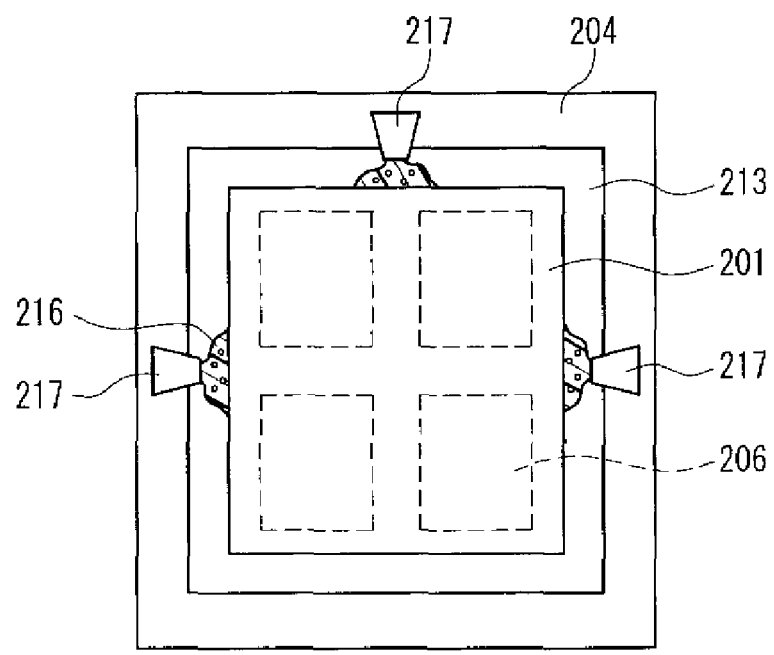

Furthermore, the supply of the solder resin composition is not limited to the method of Embodiment 1 of the present invention shown in FIG. 3A. For example, as shown in FIG. 3B, the solder resin composition may be supplied while moving in one end face direction of the semiconductor chip 206. Furthermore, as shown in FIG. 4A, the solder resin composition may be supplied while moving on end faces in two directions of the semiconductor chip 206, or as shown in FIG. 4B, the solder resin composition 216 may be supplied from each end face in three directions of the semiconductor chip 206. Consequently, the solder resin composition 216 can be supplied to the gap uniformly, and it is possible to decrease the possibility of a region without the solder resin composition being formed in the gap between the semiconductor chip and the circuit board due to air bubbles or the like.

In the case where a plurality of semiconductor chips 206 are flip chip mounted on the circuit board 213 simultaneously by the supply methods shown in FIGS. 4 and 5, the effect thereof is great because the production time and production cost of a flip chip mounted body can be reduced remarkably.

Furthermore, according to Embodiment 1 of the present invention, the semiconductor chip also can be applied to, for example, flip chip mounting of a compound semiconductor such as a semiconductor chip made of silicon-germanium or gallium-arsenic, as well as the semiconductor chip made of silicon. That is, a thin semiconductor chip made of silicon or a semiconductor chip made of a compound with weak mechanical strength can be flip chip mounted at a small load, so that a highly reliable flip chip mounted body can be realized.

Furthermore, an example has been illustrated in which the electrode terminals 207 of the semiconductor chip 206 and the connection terminals 211 of the circuit board 213 are set to have a predetermined spacing under the condition that the semiconductor chip 206 and the circuit board 213 are aligned as shown in FIG. 2B. However, the electrode terminals 207 of the semiconductor chip 206 and the connection terminals 211 of the circuit board 213 may be brought into contact with each other under the condition that the semiconductor chip 206 and the circuit board 213 are aligned for the following reason. The connection terminals of the circuit board 213 are formed as projections with respect to the board surface, whereas the electrodes on the semiconductor chip 206 are substantially flat. Thus, a gap corresponding to the thickness of the connection terminals of the circuit board is formed between the semiconductor chip 206 and the circuit board 213 even if a predetermined spacing is not formed. This is because a resin can be self-assembled on the periphery of the electrode terminals 207 of the semiconductor chip 206 and the connection terminals 211 of the circuit board 213 via the gap.

Although Embodiment 1 of the present invention has been described with reference to the views in which the pickup jig and the holding platform are placed horizontally, the present invention is not limited thereto. For example, the pickup jig and the holding platform may be placed so as to be inclined in such a manner that the end face direction in which the solder resin composition is supplied by a capillary phenomenon is set to be high. Consequently, the solder resin composition is not only supplied by a capillary phenomenon but also is dropped along the inclination due to the self-weight of the solder resin composition, whereby the supply speed can be enhanced. This can enhance the flowability of the solder resin composition in the gap to enable flip chip mounting in a short period of time. A resin component of the solder resin composition also can be discharged in a short period of time. Therefore, flip chip mounting excellent in productivity can be realized.

Embodiment 2

Hereinafter, a flip chip mounting method in Embodiment 2 of the present invention will be described with reference to FIGS. 5A-5E. FIGS. 5A-5E are schematic cross-sectional process views illustrating the flip chip mounting method in Embodiment 2 of the present invention. Embodiment 2 of the present invention is different from Embodiment 1 in that a semiconductor chip is flip-chip mounted on a circuit board while being mounted on an interposer. In FIGS. 5A-5E, the same constituent elements as those in FIGS. 2A-2E are denoted with the same reference numerals as those therein.

Figure 5A:
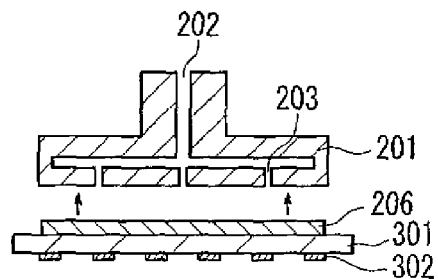
FIGS. 5A to 5E are schematic cross-sectional process views illustrating a flip chip mounting method in Embodiment 2 of the present invention.

First, as shown in FIG. 5A, a semiconductor chip 206 mounted at least on an interposer 301 is held by a pickup jig 201. Herein, the semiconductor chip 206 is mounted on the interposer 301 by a flip chip mounting method, a wire bonding method, or the like. A plurality of electrode terminals (not shown) of the semiconductor chip 206 are connected electrically to a plurality of external connection terminals 302 formed on the surface of the interposer 301. Then, the interposer 301 is held by vacuum aspiration, for example, via a suction path 203 formed of small holes and a suction pipe 202 provided in the pickup jig 201.

Figure 5B:
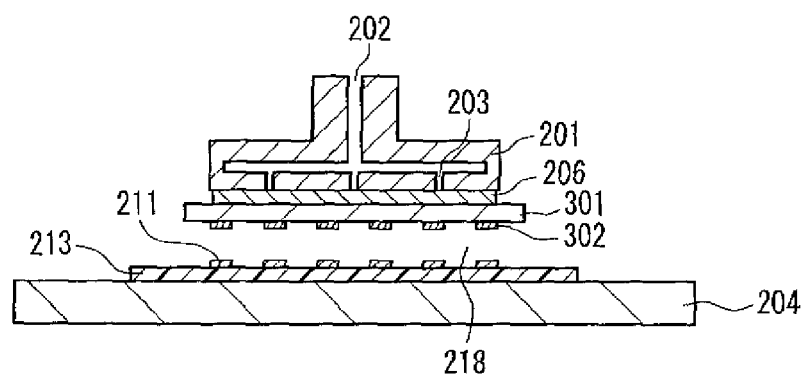

Next, as shown in FIG. 5B, the pickup jig 201 holding the interposer 301 with the semiconductor chip 206 mounted thereon is placed on the circuit board 213 having the plurality of connection terminals 211 held, for example, by a holding platform 204 such as a table by aspiration or the like. In the arrangement, the external connection terminals 302 of the interposer 301 and the connection terminals 211 of the circuit board 213 are aligned so as to be opposed to each other, for example, with an image recognition apparatus such as a camera. The circuit board 213 also may be fixed with its position regulated, by being accommodated in a concave portion (not shown) provided in the holding platform 204.

Then, under the condition that the interposer 301 and the circuit board 213 are aligned, the holding platform 204 or the pickup jig 201 is moved to a position where a predetermined spacing is provided between the external connection terminals 302 of the interposer 301 and the connection terminals 211 of the circuit board 213. In this case, the predetermined spacing is provided so that a solder resin composition described below can enter by a capillary phenomenon, and the external connection terminals 302 and the connection terminals 211 do not contact each other and melted solder power can enter therebetween. For example, the predetermined spacing is about 30 μm to 300 μm.

Furthermore, the interposer 301 or the circuit board 213 is heated via the semiconductor chip 206, for example, to a temperature (150° C. to 250° C.) at which solder powder is melted with a heating apparatus such as an external heater (not shown) or a heater (not shown) incorporated in the pickup jig 201 or the holding platform 204.

Figure 5C:
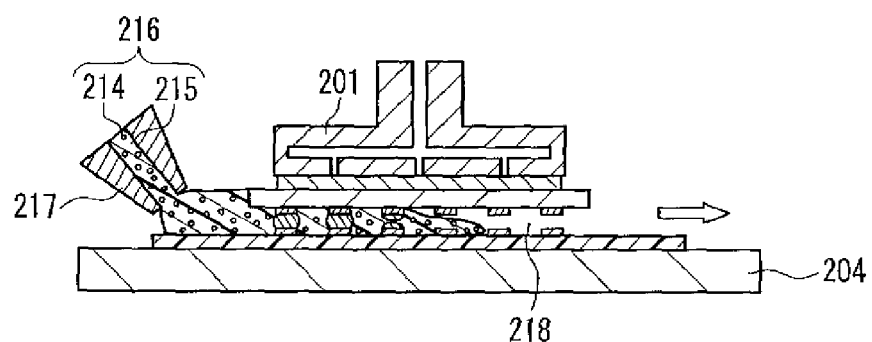

Next, as shown in FIG. 5C, a solder resin composition 216 containing solder powder 214 and a resin 215 is supplied to a gap 218 having a predetermined size from at least one end face direction of the interposer 301, using a coating apparatus 217 such as a dispenser, by a capillary phenomenon. At this time, while the solder resin composition 216 supplied to the gap 218 is flowing through the gap 218, at least a resin component is discharged from a direction (represented by an open arrow) opposite to the direction in which the solder resin composition is supplied. Herein, as the solder powder, for example, Sn—Ag based solder powder is used.

In the step in which a solder component is discharged while the solder resin composition 216 is supplied and flows, the solder powder 214 contained in the solder resin composition 216 is melted by heating. Then, the melted solder powder 214 is self-assembled and grows between the connection terminals 211 of the circuit board 213 and the external connection terminals 302 of the interposer 301, whereby solder layers 219 connecting the connection terminals 211 electrically to the external connection terminals 302 are formed. More specifically along with the flow of the solder resin composition 216, the melted solder powder 214 floating in the solder resin composition 216 is self-assembled selectively on the connection terminals 211 and the external connection terminals 302 having high wettability, whereby the solder layers 219 are formed finally between the connection terminals 211 and the external connection terminals 302.

Figure 5D:
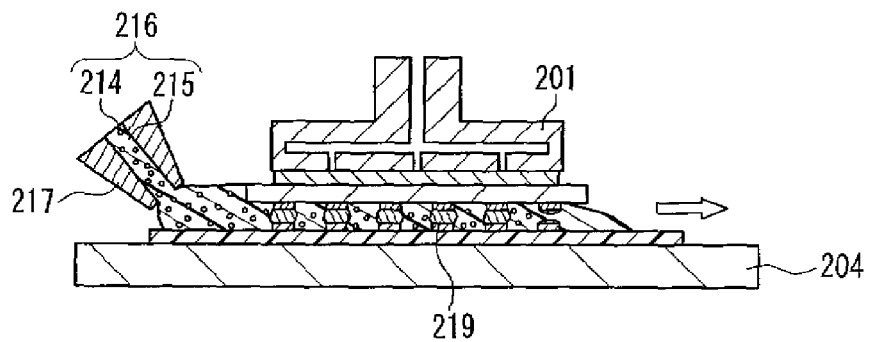

Next, as shown in FIG. 5D, as the solder resin composition 216 flows through the gap 218, the solder layers 219 are formed successively between the external connection terminals 302 and the connection terminals 211. Then, after the solder layers 219 are formed, for example, the resin 215 made of a thermoplastic resin in the solder resin composition 216 supplied to the gap 218 is cured by, for example, water circulation, forceful cooling by a cooling apparatus (not shown) such as a Peltier element incorporated in the pickup jig 201 or the holding platform 204, or natural cooling. Consequently, the external connection terminals 302 of the interposer 301 and the connection terminals 211 of the circuit board 213 are connected electrically by the solder layers 219, and simultaneously, they adhere to or are fixed to each other with the resin 215 in a similar manner to that of an underfill. In the case where the resin 215 in the solder resin composition 216 is, for example, a thermosetting resin, the pickup jig 201 or the holding platform 204 may be cured by being once heated to a temperature for curing the resin 215 or higher. At this time, in the case where the resin 215 is cured to shrink, it is preferred to set the gap 218 to be narrow to such a degree that the resin 215 is cured to shrink. This can prevent the decrease in adhesive strength caused by the peeling between the resin 215 and the semiconductor chip 206.

Figure 5E:
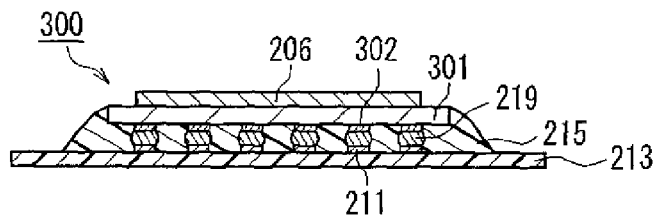

Then, as shown in FIG. 5E, the resultant stack is removed from the pickup jig 201, whereby a flip chip mounted body 300 in which the interposer 301 with the semiconductor chip 206 mounted thereon is flip-chip mounted on the circuit board 213 can be produced.

According to Embodiment 2 of the present invention, the effects similar to those in Embodiment 1 are obtained.

Embodiment 3

Hereinafter, a flip chip mounting method in Embodiment 3 of the present invention will be described with reference to FIGS. 6A-6E and FIGS. 7A-7E. FIG. 6A-6E and FIGS. 7A-7E are schematic cross-sectional process views illustrating the flip chip mounting method in Embodiment 3 of the present invention. In FIGS. 6A-6E and FIGS. 7A-7E, the same constituent elements as those in FIGS. 2A-2E are denoted with the same reference numerals as those therein.

Figure 6A:
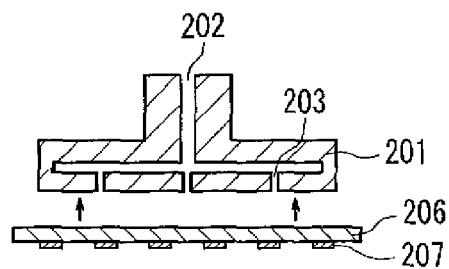
FIGS. 6A to 6E are schematic cross-sectional process views illustrating a flip chip mounting method in Embodiment 3 of the present invention.

First, as shown in FIG. 6A, a semiconductor chip 206 having a plurality of electrode terminals 207 is held by a pickup jig 201. The semiconductor chip 206 is held by vacuum suction, for example, via a suction path 203 formed of small holes and a suction pipe 202 provided in the pickup jig 201.

Figure 6B:
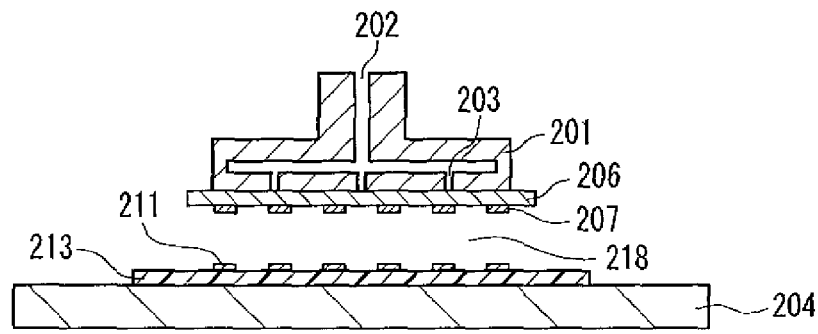

Next, as shown in FIG. 6B, the pickup jig 201 holding the semiconductor chip 206 is placed, for example, on a circuit board 213, which has a plurality of connection terminals 211, held by a holding platform 204 such as a table by aspiration or the like. In the arrangement, the electrode terminals 207 of the semiconductor chip 206 and the connection terminals 211 of the circuit board 213 are aligned so as to be opposed to each other, for example, with an image recognition apparatus such as a camera. The circuit board 213 also can be fixed with its position regulated, by being accommodated in a concave portion (not shown) provided in the holding platform 204.

Then, under the condition that the semiconductor chip 206 and the circuit board 213 are aligned, the holding platform 204 or the pickup jig 201 is moved to a position where a predetermined spacing is provided between the electrode terminals 207 of the semiconductor chip 206 and the connection terminals 211 of the circuit board 213. In this case, the predetermined spacing is provided so that a solder resin composition described below can enter by a capillary phenomenon, and the electrode terminals 207 and the connection terminals 211 do not contact each other and melted solder power can enter therebetween. For example, the predetermined spacing is about 30 μm to 300 μm.

Furthermore, the semiconductor chip 206 or the circuit board 213 is heated, for example, to a temperature (150° to 250° C.) at which solder powder is melted with a heating apparatus such as an external heater (not shown) or a heater (not shown) incorporated in the pickup jig 201 or the holding platform 204.

Figure 6C:
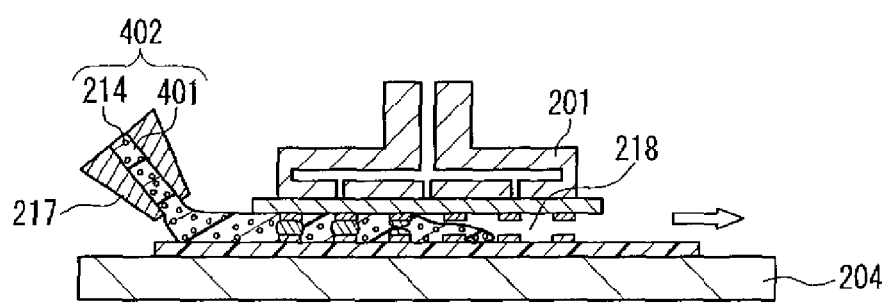

Next, as shown in FIG. 6C, a solder resin composition 402 containing solder powder 214 and a first resin 401 is supplied to a gap 218 having a predetermined size from at least one end face direction of the semiconductor chip 206, using a coating apparatus 217 such as a dispenser, by a capillary phenomenon. At this time, while the solder resin composition 402 supplied to the gap 218 flows through the gap 218, a resin component is discharged from a direction (represented by an open arrow) opposite to the direction in which the solder resin composition 402 is supplied. Herein, as the solder powder, for example, Sn—Ag based solder powder is used.

In the step in which a solder resin component is discharged while the solder resin composition 402 is supplied and flows, the solder powder 214 contained in the solder resin composition 402 is melted by heating. Then, the melted solder powder 214 is self-assembled and grows between the connection terminals 211 of the circuit board 213 and the electrode terminals 207 of the semiconductor chip 206, whereby solder layers 219 connecting the connection terminals 211 electrically to the electrode terminals 207 are formed. More specifically, the melted solder powder 214 floating in the solder resin composition 402 is self-assembled selectively on the connection terminals 211 or the electrode terminals 207 having high wettability, whereby the solder layers 219 are formed finally between the connection terminals 211 and the electrode terminals 207.

Figure 6D:
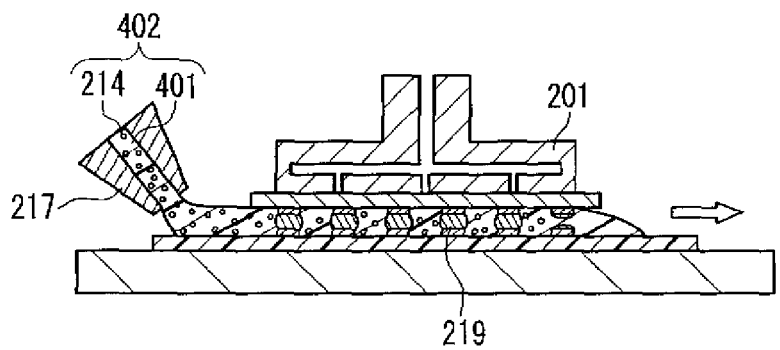
Figure 6E:
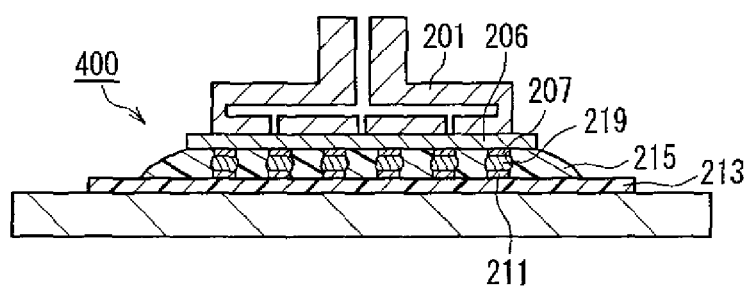

Next, as shown in FIG. 6D, as the solder resin composition 402 flows through the gap 218, the solder layers 219 are formed successively between the electrode terminals 207 and the connection terminals 211. Then, as shown in FIG. 6E, the uniform solder layers 219 without variations are formed over an entire region between the electrode terminals 207 of the semiconductor chip 206 and the connection terminals 211 of the circuit board 213. At this time, the gap 218 is filled with the first resin 401 in an uncured state. Reference numeral 400 denotes a flip chip mounted body thus obtained.

The above steps are the same as those in Embodiment 1 and the following steps are different from those in Embodiment 1.

Figure 7A:
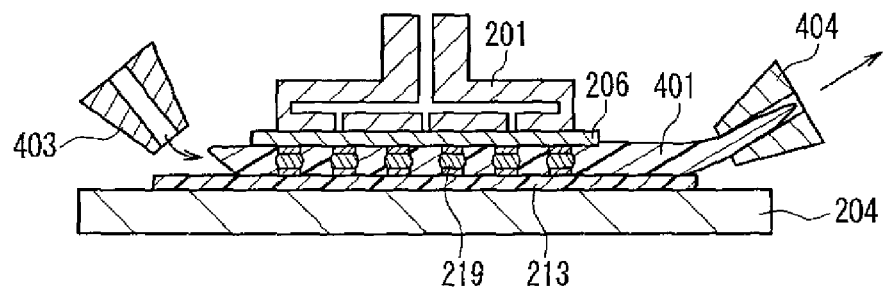
FIGS. 7A to 7E are schematic cross-sectional process views illustrating a flip chip mounting method in Embodiment 3 of the present invention.
Figure 7B:
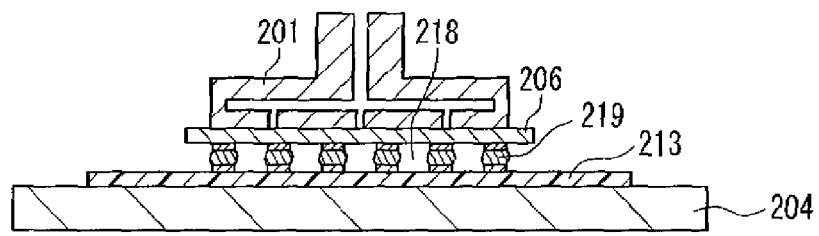

Next, as shown in FIG. 7A, the first resin 401 filling the gap 218 is discharged. Herein, the first resin 401 can be discharged, for example, by injecting inactive gas or air from a nozzle 403 and using the pressure of the injected gas. Furthermore, along with the injection of gas or the like, the first resin 401 may be discharged by aspiration with a suction pipe 404 under a reduced pressure. The discharge of the first resin 401 by the injection of gas and the discharge of the first resin 401 by the aspiration with the suction pipe 404 may be performed simultaneously. When the first resin 401 is discharged, in order to prevent the shape and the like of the solder layers 219 from being deformed due to the pressure of gas or the aspiration under a reduced pressure, it is preferred to set the temperatures of the pickup jig 201 and the holding platform 204 to be the curing temperature of the solder layers 219 or lower and to be the melting temperature of the first resin 401 or higher, thereby solidifying the solder layers 219. Consequently, as shown in FIG. 7B, the semiconductor chip 206 and the circuit board 213 are bonded to each other only with the solder layers 219.

Figure 7C:
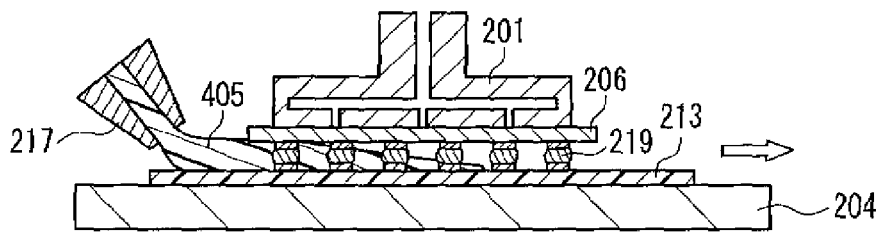

Next, as shown in FIG. 7C, after the first resin 401 is discharged from the gap 218, a second resin 405 is supplied to the gap 218 having a predetermined size from at least one end face direction of the semiconductor chip 206 by a capillary phenomenon, using a coating apparatus 217 such as a dispenser.

Figure 7D:
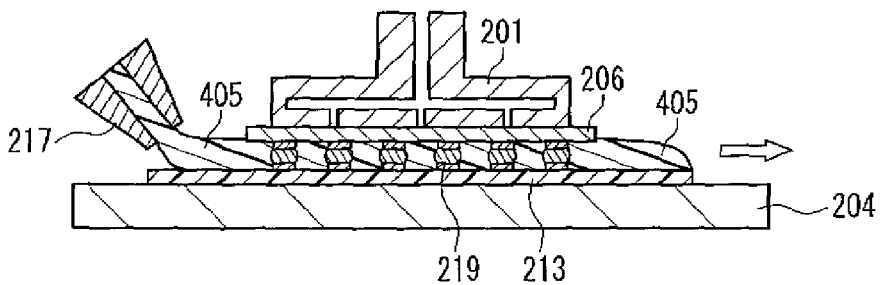

As a result, as shown in FIG. 7D, the gap between the semiconductor chip 206 and the circuit board 213 is filled again with the second resin 405. The semiconductor chip 206 is allowed to adhere to the circuit board 213 by curing the second resin 405. Herein, the second resin 405 can be cured, for example, by heating the pickup jig 201 or the holding platform 204 to a temperature at which the second resin 405 is cured or higher, if the second resin 405 is a thermosetting resin.

Figure 7E:
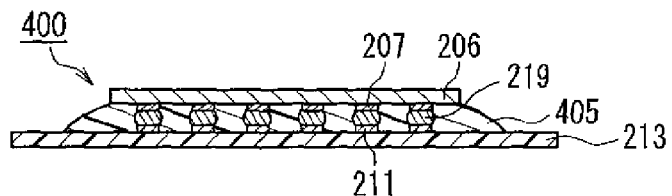

Next, as shown in FIG. 7E, the resultant stack is removed from the pickup jig 201 and the holding platform 204, whereby a flip chip mounted body 400 in which the semiconductor chip 206 is flip-chip mounted on the circuit board 213 is completed.

According to the method of Embodiment 3 of the present invention, by changing the material for the first resin 401 used in the step of forming the solder layers 219 connecting the connection terminals 211 of the circuit board 213 to the electrode terminals 207 of the semiconductor chip 206, and the material for the second resin 405 used in the step of allowing the semiconductor chip 206 to adhere to the circuit board 213, a highly reliable flip chip mounted body 400 can be produced.

More specifically as the first resin 401, a resin having viscosity suitable for keeping the flowability of the melted solder powder 214 can be used in the connection step of forming the solder layers 218. Furthermore, as the second resin 405, a resin, to which an inorganic filler that not only functions as an underfill but also alleviates a thermal expansion difference is added for example, can be used in the curing step of allowing the semiconductor chip 206 to adhere to the circuit board 213. Then, by selecting these resins independently in an optimum combination, the electrical connection and mechanical adhesion of the semiconductor chip 206 to the circuit board 213 can be performed more exactly.

The first resin 401 is not required to be curable. Therefore, the first resin 401 is not limited to a resin material such as a thermosetting resin and a thermoplastic resin illustrated in Embodiment 1, and a viscous body having appropriate viscosity can be used.

Furthermore, as a material for the viscous body, a solvent having a high boiling point, oil, or the like can be used, which is not boiled at a temperature at which solder powder is melted.

For example, as the solvent having a high boiling point, butyl carbitol, butyl carbitol acetate, or the like can be used, and as the oil, silicone oil or the like can be used. Although the viscosity of these viscous bodies is not particularly limited, 10 Pa·s or less is preferred as the viscosity at which the melted solder power is likely to move and can be supplied to the gap 218 between the semiconductor chip 206 and the circuit board 213 by a capillary phenomenon.

Furthermore, according to the method of Embodiment 3 of the present invention, even if a small amount of the melted solder powder 214 remains in the first resin 401 without being self-assembled, when the solder layers 219 are formed, the first resin 401 in which the solder powder 214 remains is discharged from the gap 218 after the solder layers 219 are formed. Therefore, the leakage between the solder layers 219, the decrease in a withstand voltage, and the like can be avoided Hereinafter, an application example of the flip chip mounting method in Embodiment 3 of the present invention will be described with reference to FIGS. 8A-8C. The application example is similar to the above example in the steps shown in FIGS. 6A-6E illustrated in Embodiment 3 and is different from the above example in the steps shown in FIGS. 7A-7E. That is, the steps in FIGS. 7A-7E are replaced by those shown in FIGS. 8A-8C.

Figure 8A:
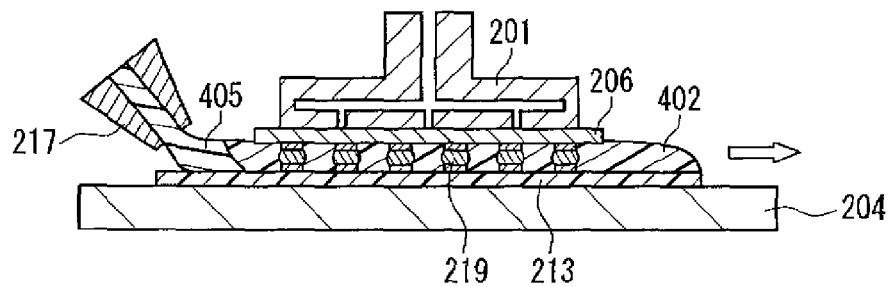
FIGS. 8A to 8C are schematic cross-sectional process views illustrating a modified example of the flip chip mounting method in Embodiment 3 of the present invention.
Figure 8B:
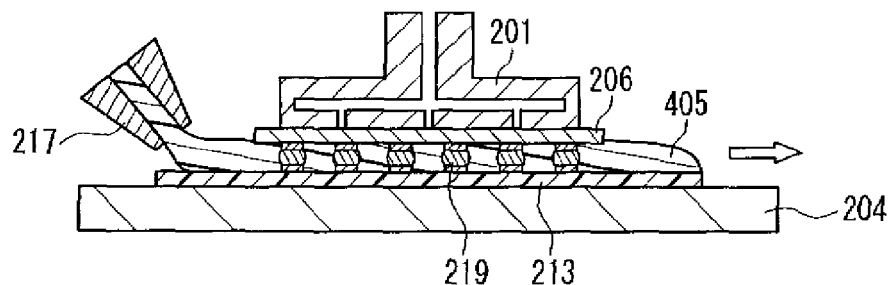
Figure 8C:
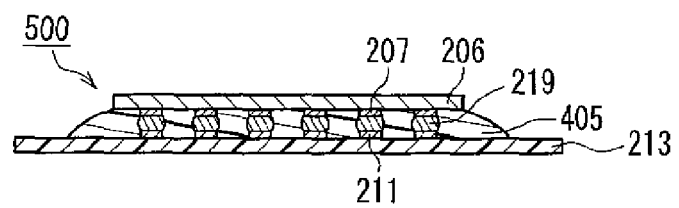

FIGS. 8A-8C are schematic cross-sectional process views illustrating a modified example of the flip chip mounting method in Embodiment 3 of the present invention.

First, as shown in FIG. 8A, the gap 218 is fled with the solder resin composition 402, whereby the solder layers 219 are formed. After that, the second resin 405 is supplied to the gap 218 having a predetermined size from at least one end face direction of the semiconductor chip 206 by a capillary phenomenon, using the coating apparatus 217 such as a dispenser. At this time, the solder powder 214 and the first resin 401 remaining in the solder resin composition 402 are discharged as a result of the supply of the second resin 405.

Then, as shown in FIG. 8B, the gap 218 between the semiconductor chip 206 and the circuit board 213 is filled again with the second resin 405. Then, the semiconductor chip 206 is allowed to adhere to the circuit board 213 by curing the second resin 405. Herein, the second resin 405 is cured, for example, by heating the pickup jig 201 or the holding platform 204 to a temperature at which the second resin 405 is cured or higher, if the second resin 405 is a thermosetting resin.

Next, as shown in FIG. 8C, the resultant stack is removed from the pickup jig 201 and the holding platform 204, whereby a flip chip mounted body 500 in which the semiconductor chip 206 is flip-chip mounted on the circuit board 213 is completed.

This method enables effects similar to those in Embodiment 3 to be obtained, and simplifies the steps, so that the productivity can be enhanced further Embodiment 4

Hereinafter, a flip chip mounting method and a flip chip mounted body in Embodiment 4 of the present invention will be described with reference to FIGS. 9A-9E and FIGS. 10A-10B. Embodiment 4 is similar to Embodiment 3 in the illustrated steps up to FIG. 7B, and different from Embodiment 3 in the subsequent steps.

Embodiment 4 of the present invention has a configuration in which the electrical characteristics such as a withstand voltage between the solder layers of the flip chip mounted body of Embodiment 3 are enhanced further, and will be described below in detail.

Figure 9A:
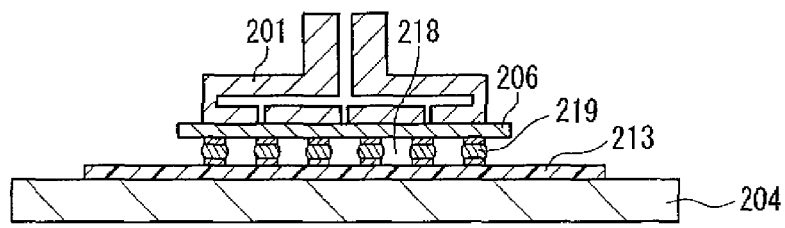
FIGS. 9A to 9E are schematic cross-sectional process views illustrating a flip chip mounting method in Embodiment 4 of the present invention.
Figure 9B:
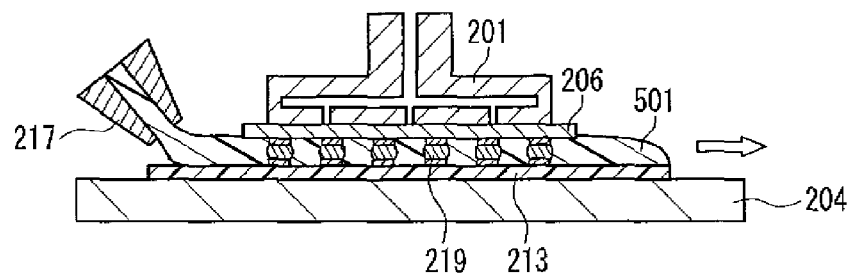
Figure 9C:
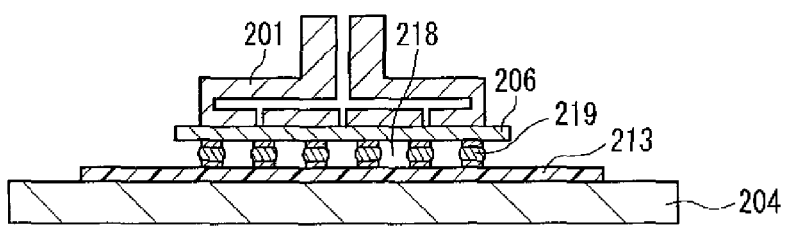
Figure 9D:
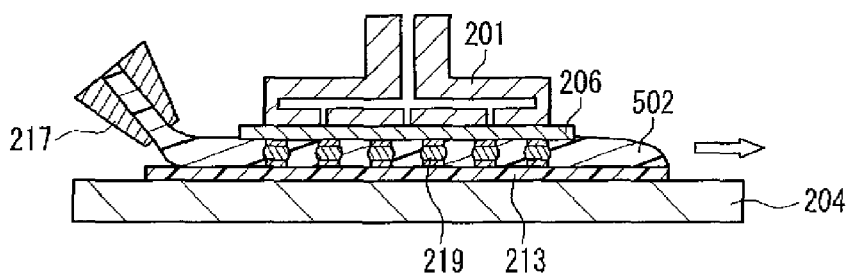
Figure 9E:
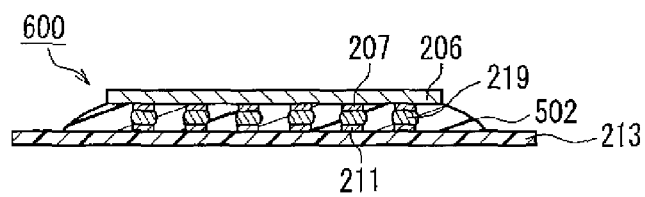
Figure 10A:
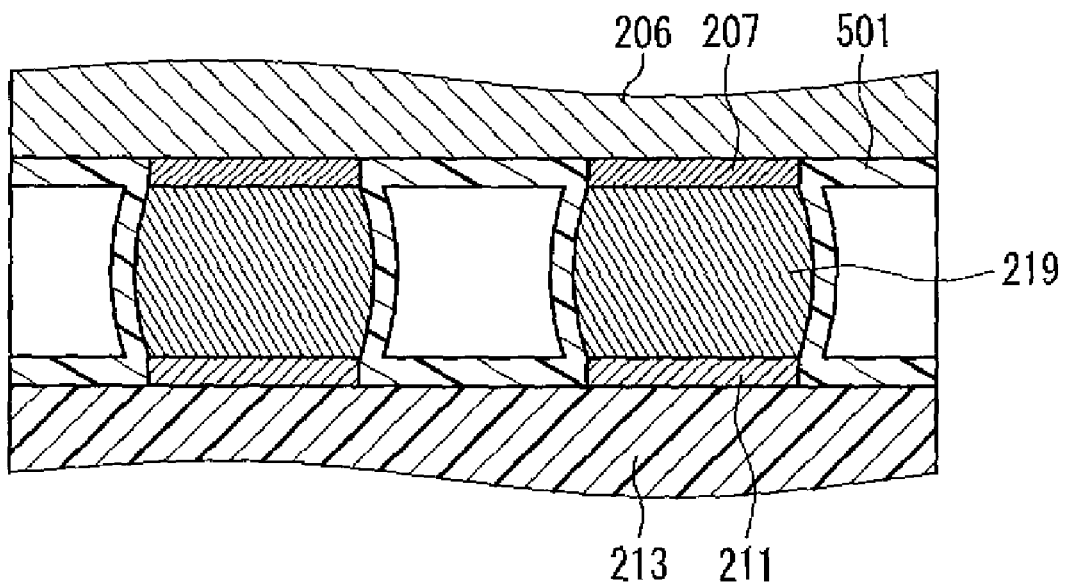
FIGS. 10A and 10B are main portion enlarged cross-sectional views illustrating the flip chip mounting method in Embodiment 4 of the present invention.
Figure 10B:
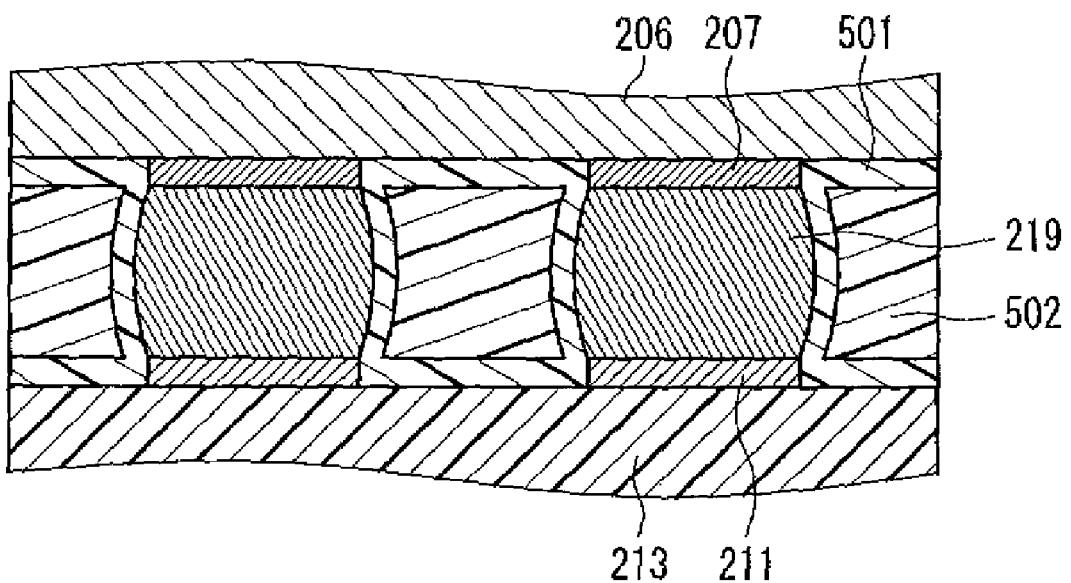

FIGS. 9A-9E are schematic cross-sectional process views illustrating the flip chip mounting method in Embodiment 4 of the present invention, and FIGS. 10A-10B are main portion enlarged cross-sectional views showing the main steps in FIGS. 9A-9E in an enlarged state.

First, FIG. 9A is a view showing a state in which the solder resin composition containing the melted solder powder and the first resin is supplied to the gap 218 to form the solder layers 219, and the resin is discharged from the gap 218, in the same way as shown in FIG. 7B of Embodiment 3.

Next, as shown in FIG. 9B, the resin other than the solder layers 219 is discharged from the gap, and thereafter, a first insulating resin 501 is supplied to the gap having a predetermined size from at least one end face direction of the semiconductor chip 206 by a capillary phenomenon, using the coating apparatus 217 such as a dispenser.

Herein, as the first insulating resin 501, for example, a thermosetting resin with a low modulus of elasticity such as a mixture of epoxy resin and flexible epoxy resin can be used. Then, the first insulating resin 501 is characterized by a low modulus of elasticity, so that it is preferred that the first insulating resin 501 does not contain an inorganic filer contained in a resin generally used as an underfill.

The first insulating resin 501 supplied to the gap does not necessarily fill the gap completely, and may be supplied so as to come into contact with at least side surfaces of the solder layers 219 when it flows through the gap to be discharged.

Next, as shown in FIG. 9C, furthermore, the first insulating resin filling the gap 218 is discharged. Herein, the first insulating resin can be discharged, for example, by injecting inactive gas and air from a nozzle, and using the pressure of the injected gas, as shown in FIG. 7A of Embodiment 3.

Consequently, as shown in FIG. 10A, the side surfaces of the solder layers 219 are covered with the first insulating resin 501. It is considered that the side surfaces of the solder layers 219 are covered with the first insulating resin 501 due to surface tension.

The surfaces of the semiconductor chip 206 and the circuit board 213 other than the side surfaces of the solder layers 219 may be covered with the first insulating resin 501.

Next, as shown in FIG. 9D, the second insulating resin 502 is supplied to the gap having a predetermined size from at least one end face direction of the semiconductor chip 206 by a capillary phenomenon, using the coating apparatus 217 such as a dispenser.

Herein, as the second insulating resin 502, for example, a resin having a high withstand voltage containing an inorganic filler, which allows the semiconductor chip 206 to adhere to the circuit board 213 as an underfill, can be used. At this time, as shown in FIG. 10B, the second insulating resin 502 fills the gap 219 so as to cover the first insulating resin 501. That is, the second resin in Embodiment 3 is composed of the first insulating resin 501 and the second insulating resin 502.

When the second insulating resin 502 is supplied, it is preferred that the first insulating resin 501 is provisionally cured after being supplied so as to prevent the first insulating resin 501 covering the side surfaces of the solder layers 219 from being melted to come off. Provisional curing can be performed by heating, for example, the pickup jig 201 or the holding platform 204.

As shown in FIG. 9E, the electrode terminals 207 of the semiconductor chip 206 and the connection terminals 211 of the circuit board 213 are connected electrically via the solder layers 219, and the solder layers 219 are covered with the first insulating resin 501. Furthermore, the semiconductor chip 206 and the circuit board 213 are allowed to adhere to each other with the second insulating resin 502, whereby a flip chip mounted body 600 is produced.

In general, when an inorganic filler or the like is added as an underfill, the thermal expansion coefficient of the semiconductor chip 206 is matched with that of the circuit board 213, and the modulus of elasticity and curing shrinkage are increased, whereby the adhesion between the electrode terminals 207 of the semiconductor chip 206 and the connection terminals 211 of the circuit board 213 is ensured.

However, for example, when a temperature cycle and the like are added so as to have high modulus of elasticity and high shrinkage, a stress is concentrated on the electrode terminals 207 of the semiconductor chip 206 and the connection terminals 211 of the circuit board 213, whereby the reliability is degraded more due to peeling.

According to Embodiment 4 of the present invention, the solder layers are covered with the second insulating resin (corresponding to the underfill) via the first insulating resin having a low modulus of elasticity, so that the stress caused by the second insulating resin can be alleviated with the first insulating resin. This prevents the decrease in a withstand voltage between the solder layers, and alleviates the stress occurring due to the temperature cycle or the like, so that a flip chip mounted body excellent in electrical characteristics and reliability can be realized.

Although the present invention has been described using each embodiment, such a description does not limit the present invention and can be modified variously, and each embodiment can be applied to each other.

In the embodiments of the present invention, although solder powder has been described using Sn—Ag based solder the solder powder is not limited thereto. The solder powder may be, for example, Sn—Zn based or Sn—Bi based solder free of Pb.

Furthermore, the flip chip mounting apparatus used in each embodiment of the present invention will be described with reference to FIG. 11.

Figure 11A:
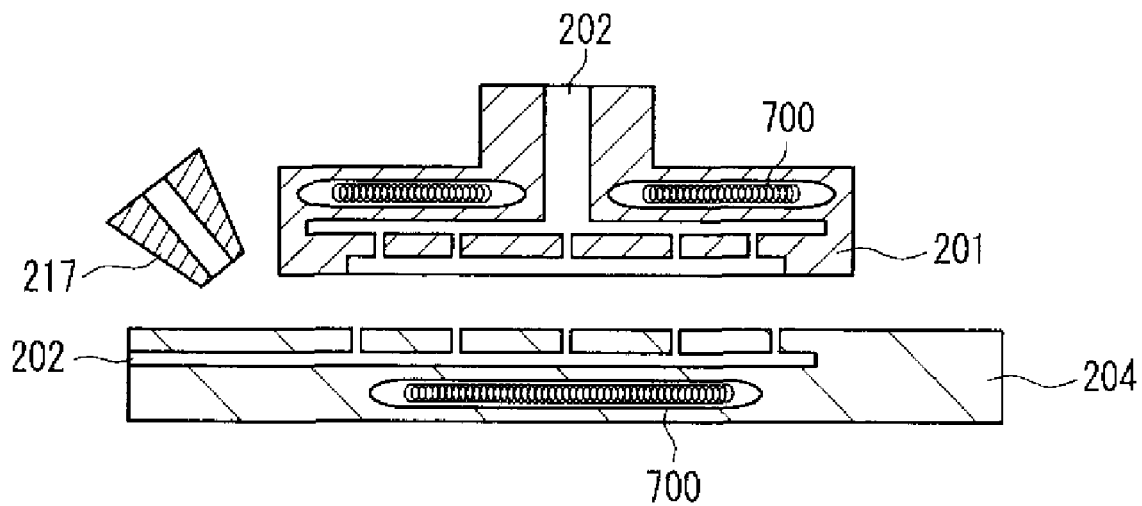
FIG. 11 is a main portion configuration cross-sectional view of a flip chip mounting apparatus used in each embodiment of the present invention.

FIG. 11 is a main portion configuration cross-sectional view of a flip chip mounting apparatus used in each embodiment of the present invention.

As shown in FIG. 11, the flip chip mounting apparatus includes the pickup jig 201 holding a semiconductor chip and the holding platform 204 holding a circuit board as main constituent elements. Then, the pickup jig 201 and the holding platform 204 have a suction pipe 202 for aspiration for holding a semiconductor chip and a circuit board, and a heating apparatus 700 such as a heater for heating.

The heating apparatus also may be provided outside. The flip chip mounting apparatus further has a coating apparatus 217 such as a dispenser supplying a solder resin composition. Although not shown, for the purpose of aligning a semiconductor chip with a circuit board, the flip chip mounting apparatus includes a movement device capable of aligning three-dimensionally and placing the pickup jig 201 and the holding platform 204 based on an image recognition apparatus such as a camera and information thereof. The detailed description of each apparatus will be omitted since it has been shown in the embodiments.

Furthermore, a detection device such as a probe that is connected to the circuit board to inspect electrical characteristics may be mounted on the above flip chip mounting apparatus. Because of this, the flip chip mounting can be inspected while the connection state between the semiconductor chip and the circuit board via the solder layers is being monitored. Consequently, a flip chip mounted body having high yield and being excellent in reliability can be produced.

INDUSTRIAL APPLICABILITY

The present invention is applicable to flip chip mounting of a next-generation semiconductor chip whose pitch is being narrowed, and is useful in the field that desires flip chip mounting excellent in productivity and reliability.

The invention claimed is:

1. A flip chip mounting method for placing a semiconductor chip having a plurality of electrode terminals so that it is opposed to a circuit board having a plurality of connection terminals, and connecting the connection terminals of the circuit board electrically to the electrode terminals of the semiconductor chip, the method comprising:
  a holding step of holding the circuit board and the semiconductor chip;
  an arrangement step of aligning the connection terminals of the circuit board with the electrode terminals of the semiconductor chip while holding the connection terminals and the electrode terminals in a contact state, or aligning the connection terminals of the circuit board with the electrode terminals of the semiconductor chip while holding the connection terminals and the electrode terminals with a gap therebetween;
  a heating step of heating at least the circuit board or the semiconductor chip to at least a temperature at which solder powder in a solder resin composition formed of the solder powder and a liquid resin is melted;
  a supply and discharge step of supplying the solder resin composition to the gap across which the circuit board and the semiconductor chip are held, from at least one end face direction of the semiconductor chip, and simultaneously, discharging the solder resin composition in a direction other than at least one end face direction, by a capillary phenomenon; and
  a curing step of curing the resin in the solder resin composition,
  wherein in the supply and discharge step of the solder resin composition, the melted solder powder in the solder resin composition melted by heat provided in the heating step is moved by a flow of the liquid resin through the gap across which the circuit board and the semiconductor chip are held, and the solder powder is self-assembled and grown between the plurality of connection terminals and the plurality of electrode terminals, thereby connecting the connection terminals electrically to the electrode terminals through the melted solder powder.

2. The flip chip mounting method according to claim 1, wherein in the supply step, the solder resin composition supplied from at least one end face direction of the semiconductor chip is supplied while being moved along the end face.

3. The flip chip mounting method according to claim 1, wherein in the holding step, the circuit board and the semiconductor chip are held by aspiration.

4. The flip chip mounting method according to claim 1, wherein in the holding step, a plurality of the semiconductor chips are held simultaneously.

5. The flip chip mounting method according to claim 1, wherein the semiconductor chip is mounted on an interposer having a plurality of connection terminals, and the interposer with the semiconductor chip mounted thereon is connected electrically to the circuit board.

6. The flip chip mounting method according claim 1, comprising:

after connecting the connection terminals electrically to the electrode terminals with the solder resin composition, further discharging a resin component other than the solder layer;

heating at least the circuit board or the semiconductor chip to a temperature at which the solder layer is not melted and a second resin is melted;

supplying the second resin to the gap across which the circuit board and the semiconductor chip are held, from at least one end face direction of the semiconductor chip by a capillary phenomenon; and curing the second resin.

7. The flip chip mounting method according to claim 6, wherein the resin component of the solder resin composition is discharged from the other direction.

8. The flip chip mounting method according to claim 7, comprising: for supplying the second resin, a first step of supplying a first insulating resin covering at least a side surface of the solder layer; and a second step of supplying a second insulating resin covering the first insulating resin and filling a gap between the circuit board and the semiconductor chip, wherein the second resin is composed of the first insulating resin and the second insulating resin.

9. The flip chip mounting method according to claim 8, further comprising the step of provisionally curing the first insulating resin after the first step.

10. The flip chip mounting method according to claim 8, wherein the first insulating resin covers at least a side surface of the solder layer due to surface tension.

11. The flip chip mounting method according to claim 8, wherein the first insulating resin is made of a material having a modulus of elasticity lower than that of the second insulating resin.

12. The flip chip mounting method according to claim 1, wherein the solder resin composition is a viscous body.

* * * * *